(12) United States Patent
Loeppert (10) Patent No.: US 11,197,104 B2
(45) Date of Patent: Dec. 7, 2021

(54) MEMS TRANSDUCER INCLUDING FREE PLATE DIAPHRAGM WITH SPRING MEMBERS

(71) Applicant: Knowles Electronics, LLC, Itasca, IL (US)

(72) Inventor: Peter V. Loeppert, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 58 days.

(21) Appl. No.: 16/731,720

(22) Filed: Dec. 31, 2019

(65) Prior Publication Data
US 2020/0245077 A1 Jul. 30, 2020

Related U.S. Application Data

(60) Provisional application No. 62/797,189, filed on Jan. 25, 2019.

(51) Int. Cl.
| | |
|---|---|
| *H04R 19/00* | (2006.01) |
| *H04R 19/04* | (2006.01) |
| *H04R 1/04* | (2006.01) |
| *H04R 1/06* | (2006.01) |
| *H04R 7/04* | (2006.01) |

(Continued)

(52) U.S. Cl.
CPC ........... *H04R 19/04* (2013.01); *B81B 3/0013* (2013.01); *H04R 1/04* (2013.01); *H04R 1/06* (2013.01); *H04R 7/04* (2013.01); *H04R 7/16* (2013.01); *B81B 2201/0257* (2013.01); *B81B 2203/0127* (2013.01); *B81B 2203/0163* (2013.01); *H04R 2201/003* (2013.01)

(58) Field of Classification Search
CPC ........ H04R 19/04; H04R 19/005; H04R 1/04; H04R 1/06; H04R 7/04; H04R 7/16; H04R 7/24; H04R 2201/003; H04R 2201/0257; B81B 3/0013; B81B 2203/0163; B81B 2203/0127; B81B 3/0051
See application file for complete search history.

(56) References Cited

U.S. PATENT DOCUMENTS

| | | |
|---|---|---|
| 5,146,435 A | 9/1992 | Bernstein |
| 5,303,210 A | 4/1994 | Bernstein |
| 5,452,268 A | 9/1995 | Bernstein |

(Continued)

FOREIGN PATENT DOCUMENTS

WO   WO-2006/028331   3/2006

OTHER PUBLICATIONS

International Search Report and Written Opinion, PCT/US2020/025941, Knowles Electronics, LLC (dated Jun. 15, 2020).

*Primary Examiner* — Matthew A Eason
(74) *Attorney, Agent, or Firm* — Foley & Lardner LLP (57) ABSTRACT

A microelectromechanical system (MEMS) transducer includes a transducer substrate including an opening; a back plate including a plurality of protrusions oriented substantially perpendicular to the back plate; and a diaphragm between the transducer substrate and the back plate. The diaphragm includes a lead and a plurality of spring members. The lead is structured to suspend the diaphragm over the transducer substrate. The spring members are structured to separate the diaphragm from the transducer substrate and the back plate in the absence of a bias voltage.

22 Claims, 8 Drawing Sheets

(51) Int. Cl.
*B81B 3/00* (2006.01)
*H04R 7/16* (2006.01)

(56) References Cited

U.S. PATENT DOCUMENTS

| | | | |
|---|---|---|---|
| 5,596,222 A | 1/1997 | Bernstein | |
| 6,028,389 A | 2/2000 | Bernstein | |
| 6,168,906 B1 | 1/2001 | Bernstein et al. | |
| 7,146,016 B2 | 12/2006 | Pedersen | |
| 7,190,038 B2 | 3/2007 | Dehe et al. | |
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,885,423 B2 | 2/2011 | Weigold | |
| 7,903,831 B2 | 3/2011 | Song | |
| 2005/0207605 A1 | 9/2005 | Dehe et al. | |
| 2007/0278501 A1 | 12/2007 | Macpherson et al. | |
| 2008/0123876 A1* | 5/2008 | Sato | H04R 19/016 381/174 |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0175477 A1* | 7/2010 | Kasai | G01H 11/06 73/649 |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1* | 12/2010 | Wu | H04R 1/086 381/369 |
| 2011/0013787 A1 | 1/2011 | Chang | |
| 2011/0075875 A1 | 3/2011 | Wu et al. | |
| 2013/0075836 A1 | 3/2013 | Lee | |
| 2014/0084396 A1 | 3/2014 | Jenkins et al. | |
| 2014/0103460 A1 | 4/2014 | Dehe et al. | |
| 2014/0321687 A1 | 10/2014 | Friel et al. | |
| 2015/0014796 A1 | 1/2015 | Dehe | |
| 2016/0286317 A1* | 9/2016 | Zhao | H04R 19/04 |
| 2017/0325012 A1 | 11/2017 | Dehe et al. | |

\* cited by examiner

MEMS TRANSDUCER INCLUDING FREE PLATE DIAPHRAGM WITH SPRING MEMBERS

CROSS-REFERENCE TO RELATED APPLICATIONS

The present application claims the benefit of and priority to U.S. Provisional Application No. 62/797,189, filed Jan. 25, 2019, entitled "MEMS Transducer Including Free Plate Diaphragm with Spring Members," the disclosure of which is incorporated herein by reference in its entirety.

BACKGROUND

The present disclosure relates generally to microelectromechanical system (MEMS) transducers, particularly free plate MEMS acoustic transducers. MEMS capacitive acoustic transducers include a stationary perforated back plate and a movable diaphragm, the diaphragm moving relative to the back plate in response to incident sound pressure to generate an electrical signal. A free plate diaphragm is a colloquialism that refers to a diaphragm that is simply supported. In a free plate MEMS transducer, the diaphragm is configured to engage with posts extending from the back plate when powered. The diaphragm is lightly constrained at only one point at its periphery by an electrical lead. The diaphragm is thus limited in travel towards the back plate but is free to rotate at the posts. It is thus simply supported. When the transducer is unpowered, the diaphragm's position is indefinite and it may droop or bend under residual stress or the force of gravity toward other parts of the transducer and will likely come in contact with other structural features within the transducer. Contaminants including condensed vapors, dust, oil, cosmetics, and other small particles may accumulate in regions around these contact points and lead to stiction. This may be enhanced by the process of capillary condensation in which condensation happens preferentially in very small gaps. The term stiction is peculiar to MEMS technology and is a combination of "stick" and "friction". Stiction may impact movement of the diaphragm and may result in erratic transducer performance.

SUMMARY

A first aspect of the present disclosure relates to a MEMS acoustic transducer. The transducer includes a transducer substrate including an opening; a back plate; and a diaphragm. The back plate includes a plurality of protrusions oriented substantially perpendicular to the back plate. The diaphragm is oriented substantially parallel to the back plate. The diaphragm is located between the substrate and the back plate and is spaced apart from both the substrate and the back plate. The diaphragm is structured to move toward the back plate and contact at least one of the protrusions in the presence of a bias voltage. The diaphragm includes a lead structured to suspend the diaphragm over the transducer substrate. The diaphragm also includes a plurality of spring members structured to separate the diaphragm from the transducer substrate and the back plate in the absence of the bias voltage.

A second aspect of the present disclosure relates to a microphone assembly. The microphone assembly includes a housing including a base, a cover, and a port. The microphone includes an acoustic transducer disposed in an enclosed volume defined by the housing. The acoustic transducer includes a transducer substrate including an opening; a back plate; and a diaphragm. The back plate includes a plurality of protrusions oriented substantially perpendicular to the back plate. The diaphragm is oriented substantially parallel to the back plate. The diaphragm is located between the substrate and the back plate and is spaced apart from both the substrate and the back plate. The diaphragm is structured to move toward the back plate and contact the protrusions in the presence of a bias voltage. The diaphragm includes a lead structured to suspend the diaphragm over the transducer substrate. The diaphragm also includes a plurality of spring members. The spring members are structured to separate the diaphragm from the transducer substrate and the back plate in the absence of the bias voltage.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

In general, disclosed herein are devices and systems for constraining a position of a diaphragm, such as a free plate diaphragm, in a MEMS acoustic transducer when the transducer is non-operational (e.g., unpowered, etc.). The devices include a diaphragm including one or more spring members structured to position the diaphragm between a back plate and a transducer substrate. The spring members may prevent the diaphragm from sagging or deforming toward the transducer substrate and/or other parts of the transducer when un-powered, thereby minimizing small gaps within the transducer where contamination might otherwise accumulate. When powered, the spring members contribute at most 25% and generally less than 10% to the compliance of the diaphragm.

In one aspect, the MEMS transducer includes a transducer substrate, a back plate, and a diaphragm. The back plate and the diaphragm are coupled to (e.g., anchored to, connected to, deposited onto, etc.) the transducer substrate. The diaphragm is oriented substantially parallel to the back plate and is spaced apart from the back plate. The back plate includes multiple extension posts or protrusions that extend from the back plate toward the diaphragm. The diaphragm is configured to move toward the back plate and engage with the extension posts when the transducer is turned on (e.g., when the transducer is activated, in the presence of a bias voltage between the diaphragm and the back plate, etc.). The extension posts may be structured to set a compliance of the diaphragm when the transducer is operational by setting an effective diaphragm diameter (e.g., a diameter at which the transducer is supported by the posts).

According to an illustrative embodiment, the diaphragm includes an electrical lead and one or more springs. The electrical lead may also be a spring member. The electrical lead is structured to at least partially suspend the diaphragm above the transducer substrate. The springs are structured to position the diaphragm in between the back plate and the transducer substrate when the transducer is turned off (e.g., when the transducer is deactivated, in the absence of a bias voltage between the diaphragm and the back plate, etc.). The springs may be structured to position the diaphragm approximately midway between the transducer substrate and the back plate posts to prevent contamination induced stiction events (e.g., to prevent the accumulation of condensates, oils, dirt, and other particulate matter that might otherwise impact movement of the diaphragm).

In some embodiments, the springs may be integrally formed with the diaphragm to reduce manufacturing cost and complexity. The springs may be positioned at approximately equal intervals around the perimeter of the diaphragm. Among other benefits, the springs prevent small gaps from forming between the diaphragm and the transducer substrate, which minimizes the accumulation of dirt and other contaminates that would otherwise impact the performance of the transducer. The details of the general depiction provided above will be more fully explained by reference to FIGS. 1-8.

Figure 1:
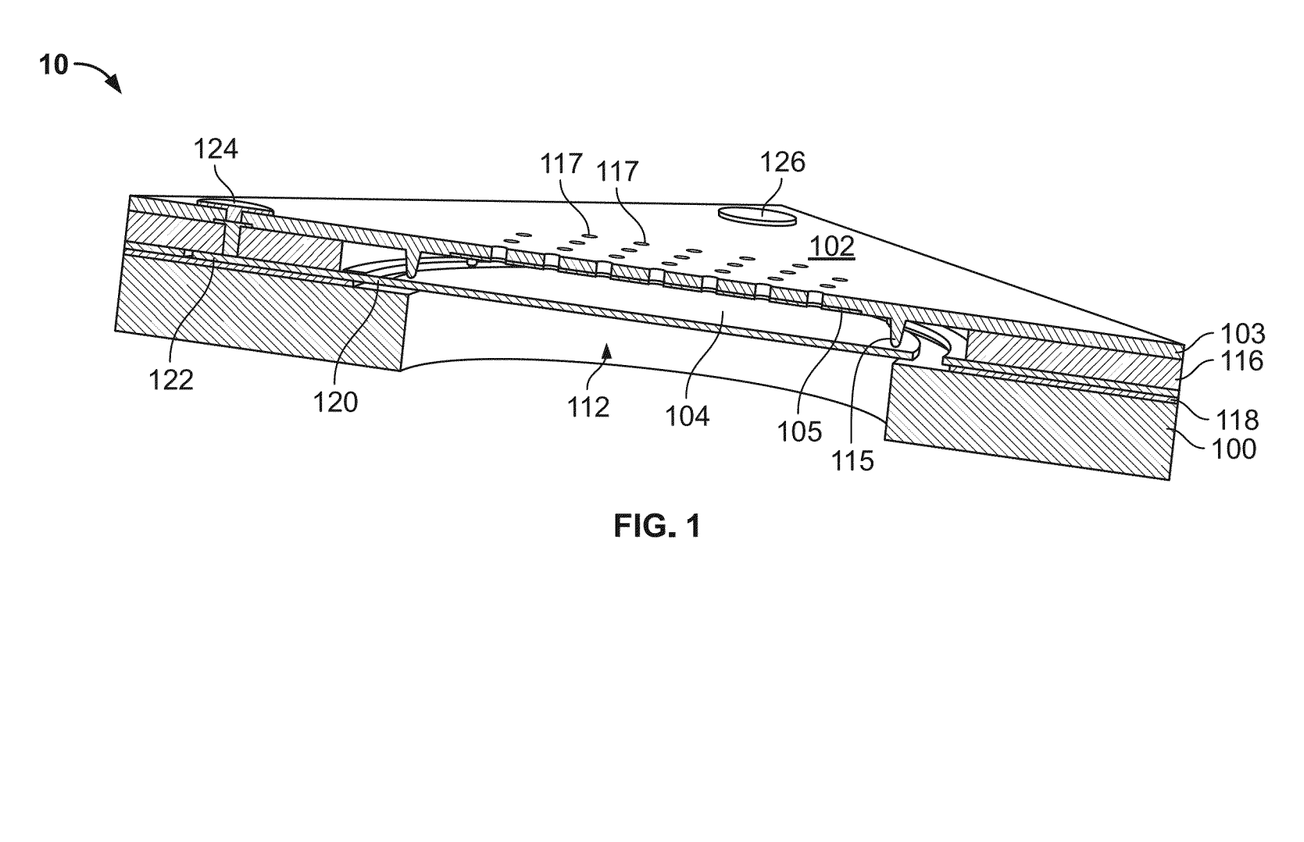
FIG. 1 is a side cross-sectional view of a MEMS free plate acoustic transducer without spring members, according to an illustrative embodiment.
Figure 2:
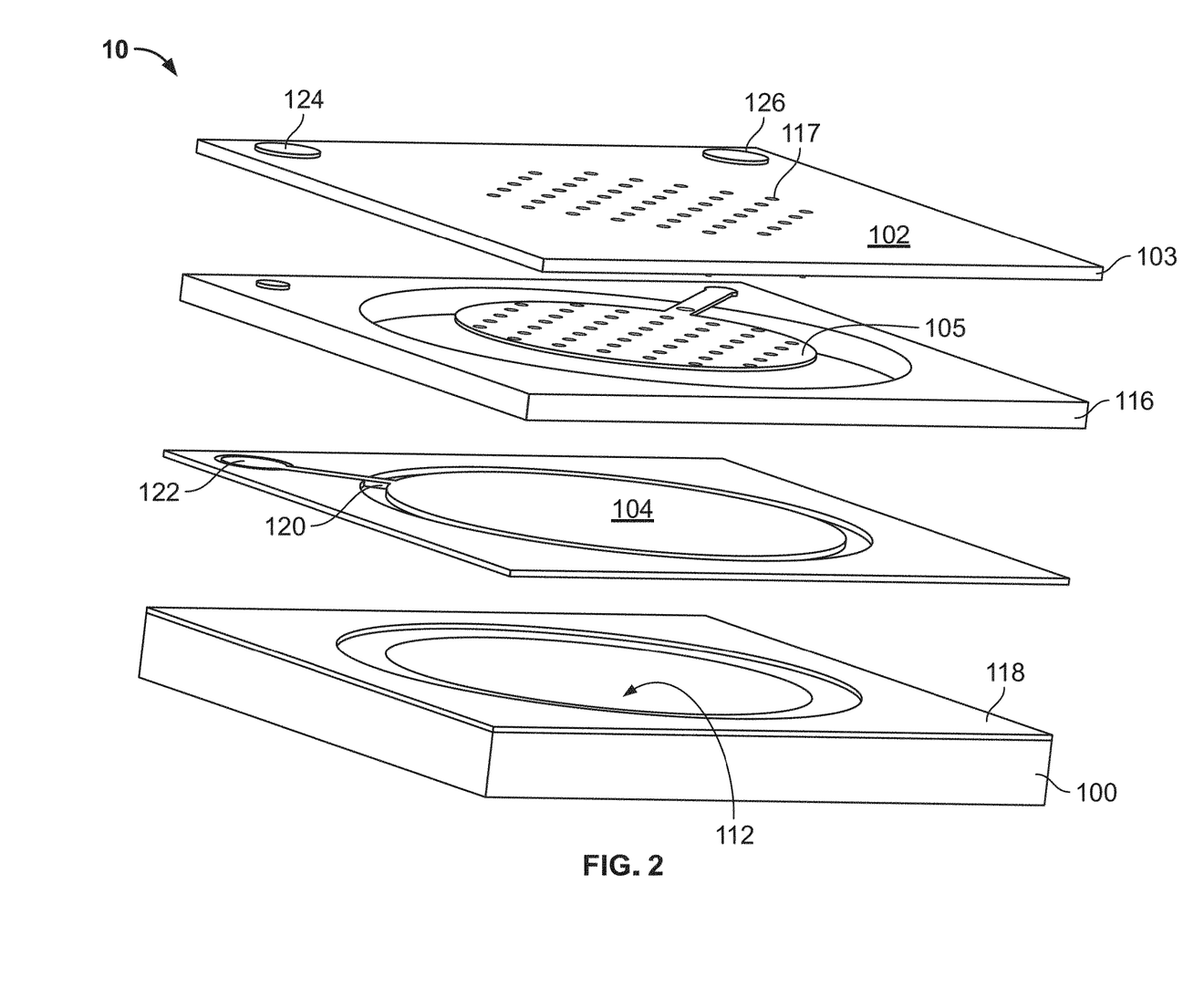
FIG. 2 is an exploded perspective view of the transducer of FIG. 1.

Referring to FIGS. 1 and 2 a MEMS transducer 10 without spring members is shown, according to an illustrative embodiment. In the embodiment of FIG. 1, the transducer 10 is configured as a capacitive acoustic transducer structured to generate an electrical signal in response to acoustic disturbances incident on the transducer 10. The transducer 10 includes a transducer substrate 100, a back plate 102, and a diaphragm 104. The transducer substrate 100 includes an aperture 112 disposed through the substrate 100. The aperture 112 may be cylindrical. The aperture 112 is structured to carry (e.g., transmit, etc.) sound energy (e.g., pressure) to at least one of the diaphragm 104 and the back plate 102.

As shown in FIG. 1, the back plate 102 includes an insulating layer 103 (e.g., an insulating material, a dielectric material) and a conductive layer 105 (e.g., a conductive material) disposed centrally thereon. The insulating layer may be made from silicon nitride or another dielectric material. In some embodiments, the diaphragm 104 includes an insulating layer and a conductive layer. In the embodiment of FIG. 1, the diaphragm 104 is made from a conductive material. The conductive material may be polycrystalline silicon or another suitable conductor. The conductive layer 105 is ultimately connected to electrical pad 126. Sound energy (e.g., sound waves, acoustic disturbances, etc.) incident on the diaphragm 104 causes the diaphragm 104 to move toward or away from the back plate 102. The change in distance results in a corresponding change in capacitance. An electrical signal representative of the change in capacitance may be generated and transmitted to other portions of an acoustic transducer, such as an integrated circuit, for processing.

As shown in FIG. 1, the back plate 102 includes a plurality of protrusions 115 oriented substantially perpendicular to the back plate 102. At least some of the protrusions 115 engage with the diaphragm 104 when the transducer 10 is operational (e.g., when power is supplied to the transducer 10, when the transducer 10 is activated, in the presence of a bias voltage between the back plate 102 and the diaphragm 104, etc.). The compliance of the diaphragm 104 during normal operation is determined, in part, by the number and arrangement of protrusions 115 on the back plate 102. As shown in FIG. 1, the protrusions 115 are structured as bumps or small extension posts that extend from a lower surface of the back plate 102 toward the diaphragm 104. The size, number, and arrangement of protrusions 115 may be different in various alternative embodiments.

In the embodiment of FIG. 1, the diaphragm 104 is disposed on a surface of the substrate by way of an intervening first sacrificial material 118. This first sacrificial material 118 may be selectively removed in the central region of the substrate thus permitting the diaphragm 104 to move. The back plate 102 is attached to a surface of the diaphragm opposite that of the substrate by way of an intervening second sacrificial material 116. This second sacrificial material may also be removed in a central region thus permitting the diaphragm 104 to move towards the back plate 102. Both the first and second sacrificial materials may be a silicon oxide or other material that can be etched without affecting the substrate 100, diaphragm 104, or back plate 102. As shown in FIGS. 1 and 2, the back plate comprises a plurality of perforations 117 which pass through both the insulating layer 103 and the conductive layer 105. The perforations 117 serve to allow air, otherwise trapped between the diaphragm 104 and the back plate 102 to escape. The size, spacing, and number of the perforations 117 are chosen to minimize air flow resistance which contributes to acoustic noise.

As shown in FIG. 1, the diaphragm 104 is structured as a free plate diaphragm in which a boundary of the diaphragm 104 is simply supported. The diaphragm 104 includes a lead 120 structured to at least partially suspend the diaphragm 104 over the transducer substrate 100 and aperture 112. One end of lead 120 is coupled to the diaphragm 104 at a single point along a perimeter of the diaphragm 104. The other end of lead 120 is coupled to a pad 122. The pad 122 is rigidly attached to the substrate 100 by the intervening first sacrificial material 118. The first sacrificial material 118 is not removed between the pad 122 and the substrate 100. Besides providing a mechanical connection to the diaphragm 104, the lead 120 also serves as an electrical connection between the diaphragm 104 and the pad 122. Pad 122 is ultimately connected to the electrical pad 124 on the surface of the back plate 102 (e.g., pad 122 extends through the intervening second sacrificial material 116). As shown in FIG. 1, the lead 120 is integrally formed with the diaphragm 104 as a single piece of material. In other embodiments, the lead 120 is coupled to an upper or lower surface of the diaphragm 104.

Figure 3:
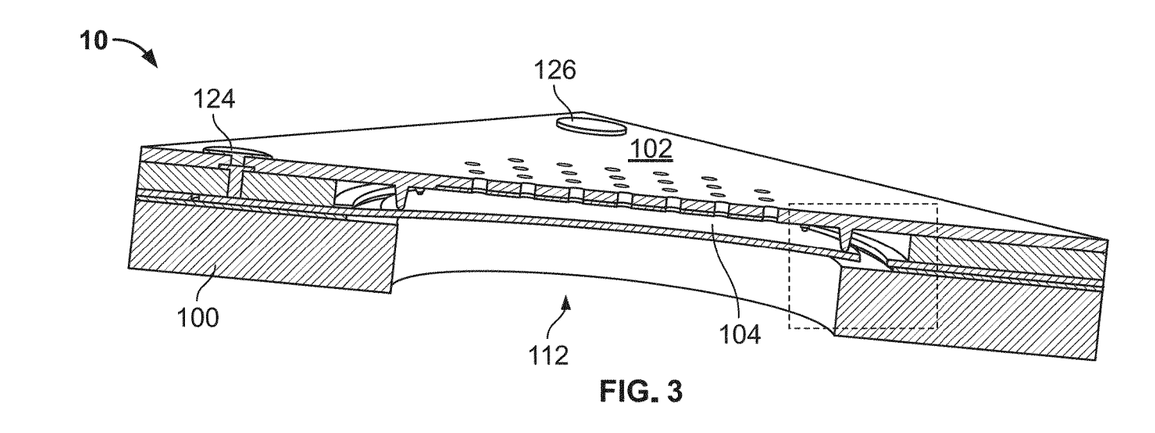
FIG. 3 is a side cross-sectional view of the transducer of FIG. 1 under bias.
Figure 3A:
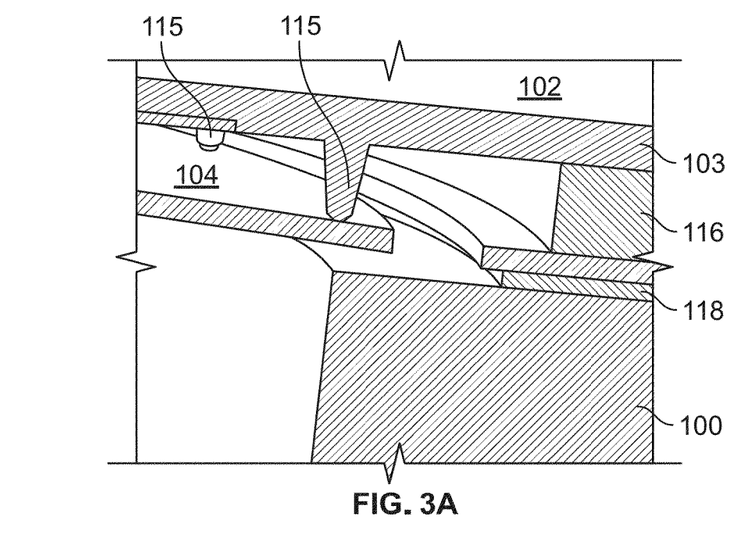
FIG. 3A is a close-up view of a portion of FIG. 3.
Figure 3B:
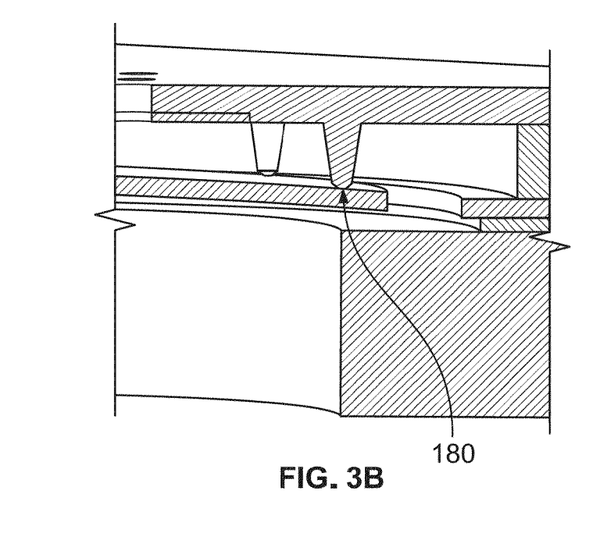
FIG. 3B is a rotated perspective of the close-up view of FIG. 3A.

Referring now to FIG. 3, the transducer 10 of FIG. 1 is depicted when a bias is applied between the diaphragm 104 and the back plate 102 by way of electrical pads 124 and 126 (e.g., when the transducer 10 is powered). Under bias, the diaphragm 104 is attracted towards the back plate 102 and comes in contact with at least one of the protrusions 115. This can be seen more clearly in in FIGS. 3a and 3b, which show a portion of the transducer 10 near the protrusions 115, where FIG. 3b is a rotated perspective of the close-up view shown in FIG. 3a. As shown in FIGS. 3a and 3b, the diaphragm 104 contacts an outer plurality of protrusions when the transducer 10 is powered. A contact point 180 at which the protrusion 115 contacts the diaphragm 104 can be clearly seen in FIG. 3b. FIGS. 3a and 3b provides a good example of the diaphragm's simply supported boundary condition when the transducer is biased.

Figure 4:
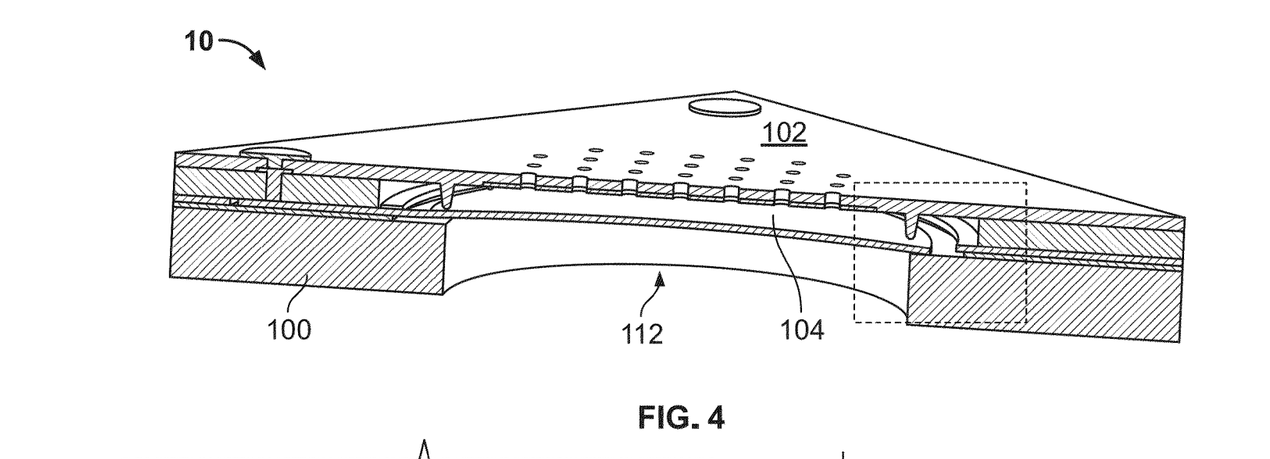
FIG. 4 is a side cross-sectional view of the transducer of FIG. 1 in an unpowered state (without bias) but under the influence of gravity.
Figure 4A:
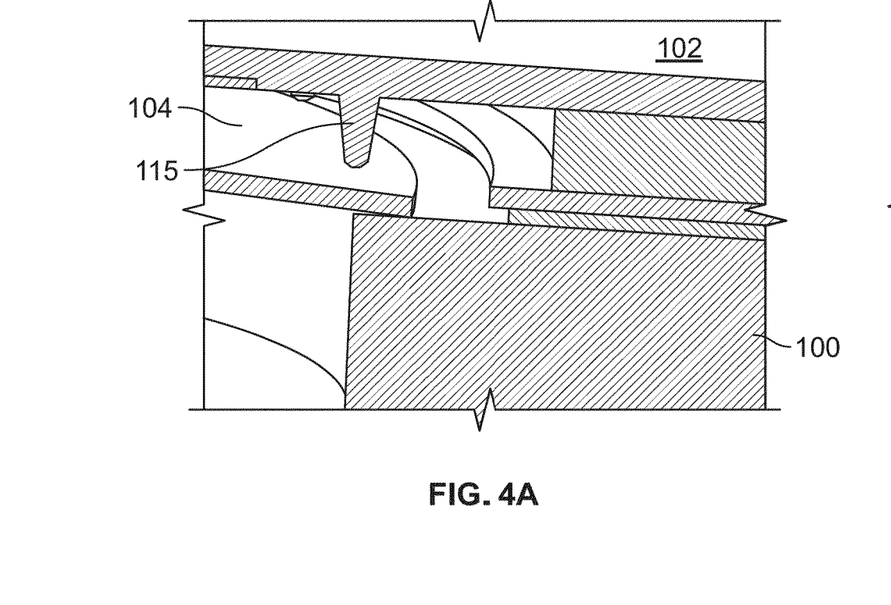
FIG. 4A is close-up view of a portion of FIG. 4.
Figure 4B:
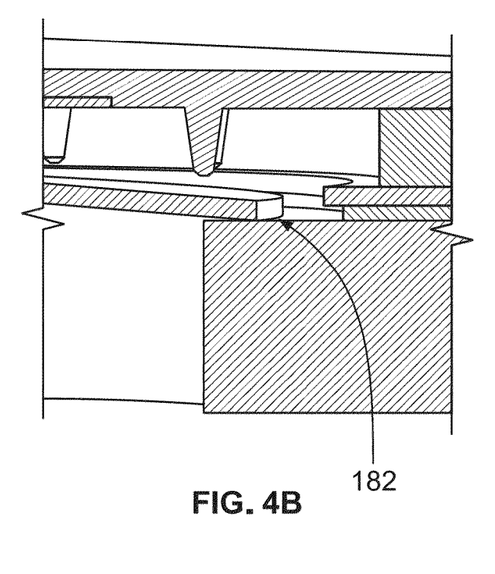
FIG. 4B is a rotated perspective of the close-up view of FIG. 4A.

Referring now to FIG. 4, the diaphragm 104 of the transducer 10 of FIG. 1 does not include spring members and may bow or bend under residual film stress and/or under gravity and may contact the substrate 100. The very small gap created around the contact point between the diaphragm 104 and the substrate 100 may lead to capillary condensation and the accumulation of liquids and particles that can result in stiction. Under bias, this stiction may lead to a delay or worse, a failure of the diaphragm 104 to move towards the back plate 102 and come in contact with the protrusions 115. This condition is clearly illustrated in the close-up view of FIG. 4a and the rotated perspective of the close-up view shown in FIG. 4b, in which the diaphragm can be seen bowing/bending away from the protrusion 115 and contacting the substrate 100 at a contact point 182.

Figure 5:
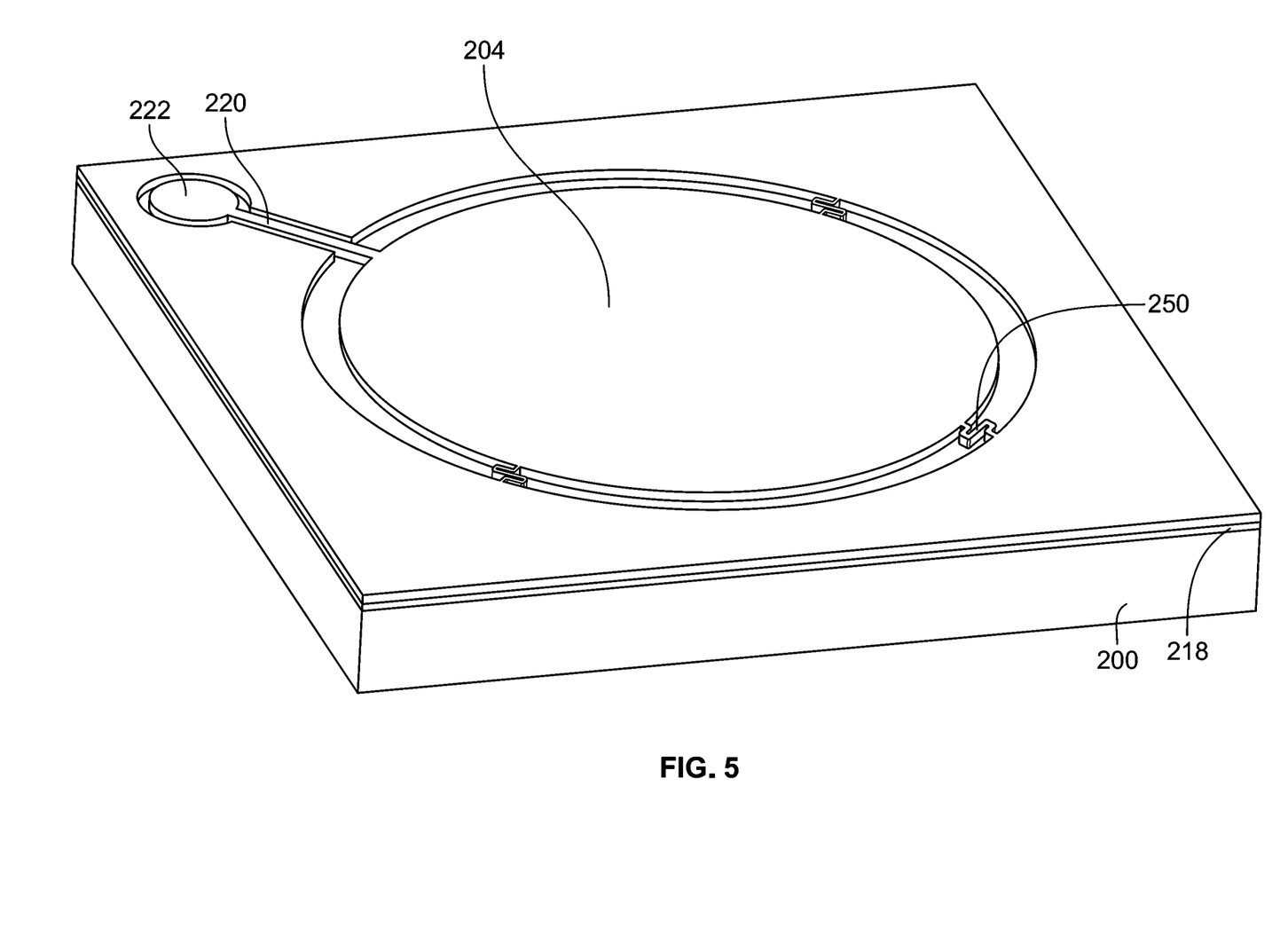
FIG. 5 is a top perspective view of a free plate diaphragm with spring members, according to an illustrative embodiment.

FIG. 5 shows an improved diaphragm 204, according to an illustrative embodiment. The diaphragm 204 is similar to the diaphragm 104 of FIG. 1. Unlike the diaphragm 104 of FIG. 1, the diaphragm 204 of FIG. 5 includes at least two spring members 250 connecting the perimeter of the diaphragm 204 to the substrate 200. The lead 220 (and pad 222) provides both a mechanical connection as well as an electrical connection to the diaphragm 204 in a manner similar to lead 120 of FIG. 1. The lead 220 and the at least two spring members 250 define a plane in which the diaphragm 204 resides when the transducer is unpowered. Residual stresses and gravity may cause the diaphragm 204 to bow or droop between the lead 220 and the spring members 250 and thus it may be desirable to have more than two spring members 250. FIG. 5 shows diaphragm 204 having three spring members 250. It is contemplated that the lead 220 and the spring members 250 are evenly spaced around the perimeter of the diaphragm 204, however other distributions are possible. In some embodiments, the lead 220 is formed as a spring member 250.

Figure 6:
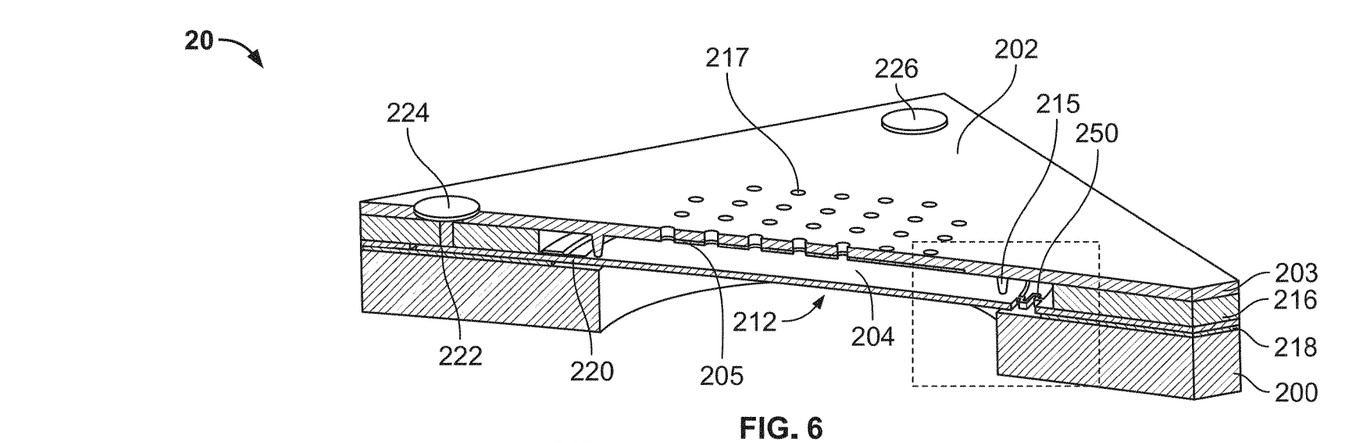
FIG. 6 is a side cross-sectional view of a transducer comprising the diaphragm of FIG. 5, according to an illustrative embodiment.

FIG. 6 shows a transducer 20 according to an embodiment which includes diaphragm 204 of FIG. 5. Similar to transducer 10 of FIG. 1, transducer 20 comprises a substrate 200 and an aperture 212 formed through the substrate 200. Diaphragm 204 is attached to a surface of substrate 200 with an intervening first sacrificial material 218. A portion of the first sacrificial material 218 is removed in a central region to permit movement of diaphragm 204. A back plate 202 is attached to the substrate 200 with an intervening second sacrificial material 216. The back plate 202 is substantially parallel to the diaphragm 204 and spaced apart from the diaphragm 204 by the second sacrificial material 216. A portion of the second sacrificial material 216 is removed in a central region to permit the diaphragm 204 to move towards the back plate 202. The back plate 202 includes protrusions 215 that extend from the surface of the back plate 202 towards the diaphragm 204. Under bias (e.g., when the transducer is powered), the diaphragm 204 moves towards the back plate 202, and comes into contact with the protrusions 215. The position of the protrusions 215 sets an effective diameter of the diaphragm 204 (e.g., a diameter of the diaphragm 204 which engages the protrusions 115).

The bending stiffness of the diaphragm 204 sets its restoring force when perturbed by a differential pressure acting upon the diaphragm 204. The compliance of the spring members 250 is small compared to the bending stiffness of the diaphragm 204. According to an illustrative embodiment, the spring members 250 contribute no more than 25% of the restoring force and typically less than 10% of the restoring force of diaphragm 204.

Figure 6A:
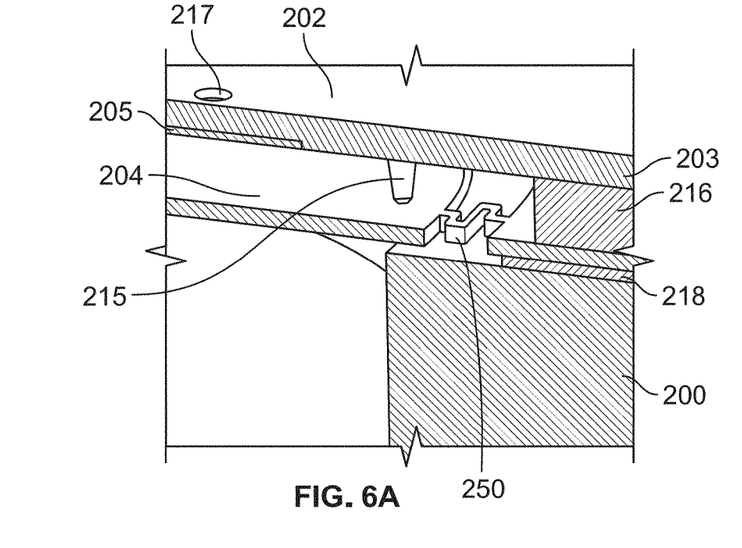
FIG. 6A is a close-up view of a spring member of the transducer of FIG. 6, according to an illustrative embodiment.

Referring now to FIG. 6A, a close-up of a spring member 250 of transducer 20 is shown, according to an illustrative embodiment. When the transducer 20 is unbiased, the spring members 250 serve to keep the diaphragm 204 centrally disposed between the substrate 200 and the protrusions 215. The spring members 250 thus minimize any contact between the diaphragm 204 and substrate 200 except under transient load conditions. The spring members 250 thus minimize the accumulation of liquids through capillary condensation and any particles swept up by the liquids and serve to further minimize stiction.

Figure 7A:
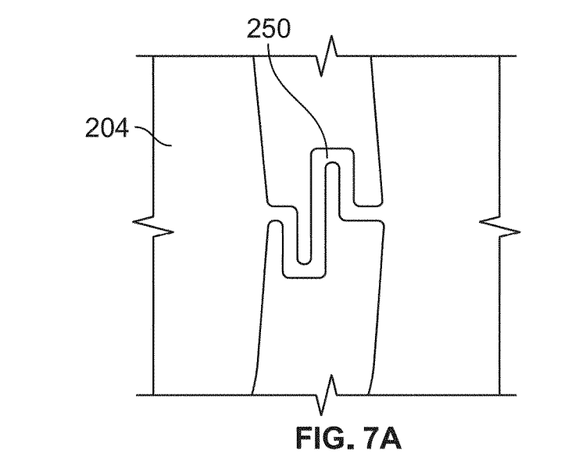
FIG. 7A is a top view of a spring member, according to an illustrative embodiment.
Figure 7B:
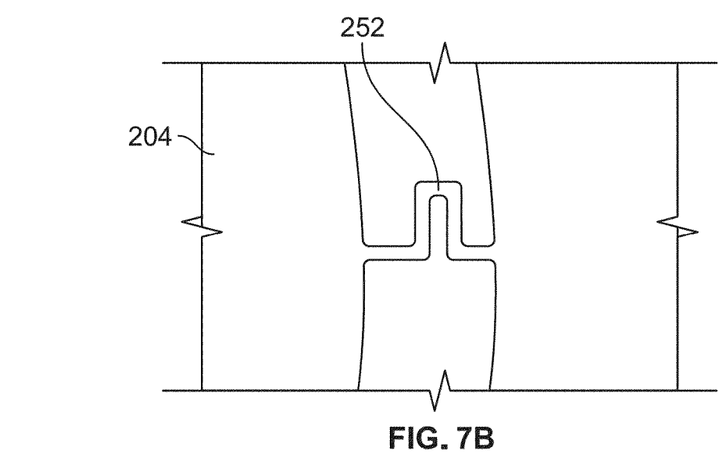
FIG. 7B is a top view of a spring member, according to another illustrative embodiment.
Figure 7C:
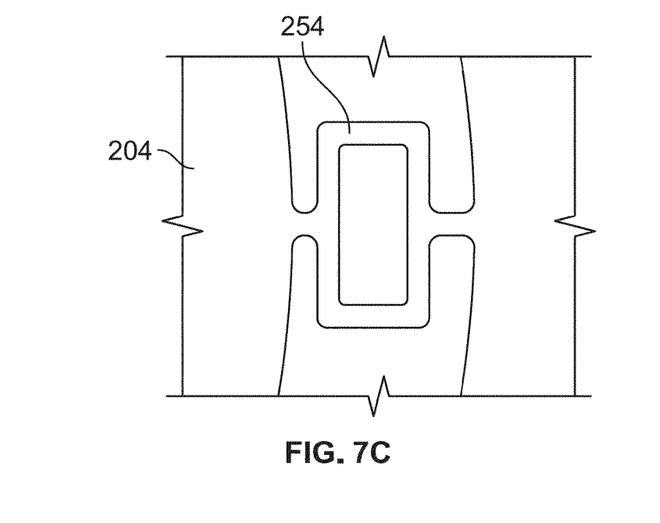
FIG. 7C is a top view of a spring member, according to another illustrative embodiment.
Figure 7D:
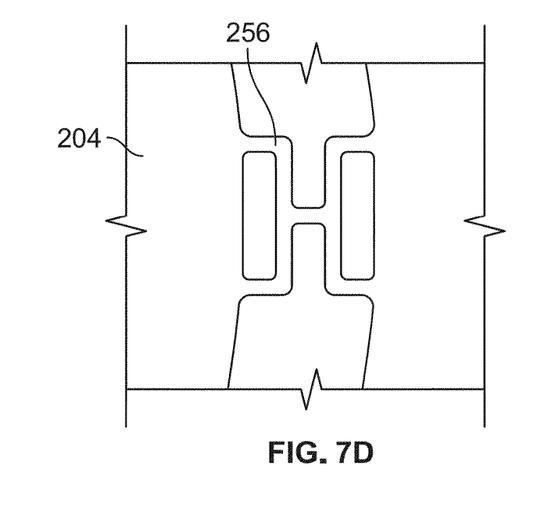
FIG. 7D is a top view of a spring member, according to another illustrative embodiment.

FIGS. 7a-7d show various alternative embodiments of spring member 250. Those skilled in the art will appreciate that these are but a few of the many possibilities for spring design. In the embodiments of FIGS. 7a-7b, the spring members include a serpentine portion that winds back and forth in a circumferential direction within a gap between the transducer substrate and the diaphragm (e.g., an S-shaped portion or a U-shaped portion). The salient requirement is to provide a compliant attachment method without causing a deflection of the diaphragm through residual stress or asymmetric geometry.

Figure 8:
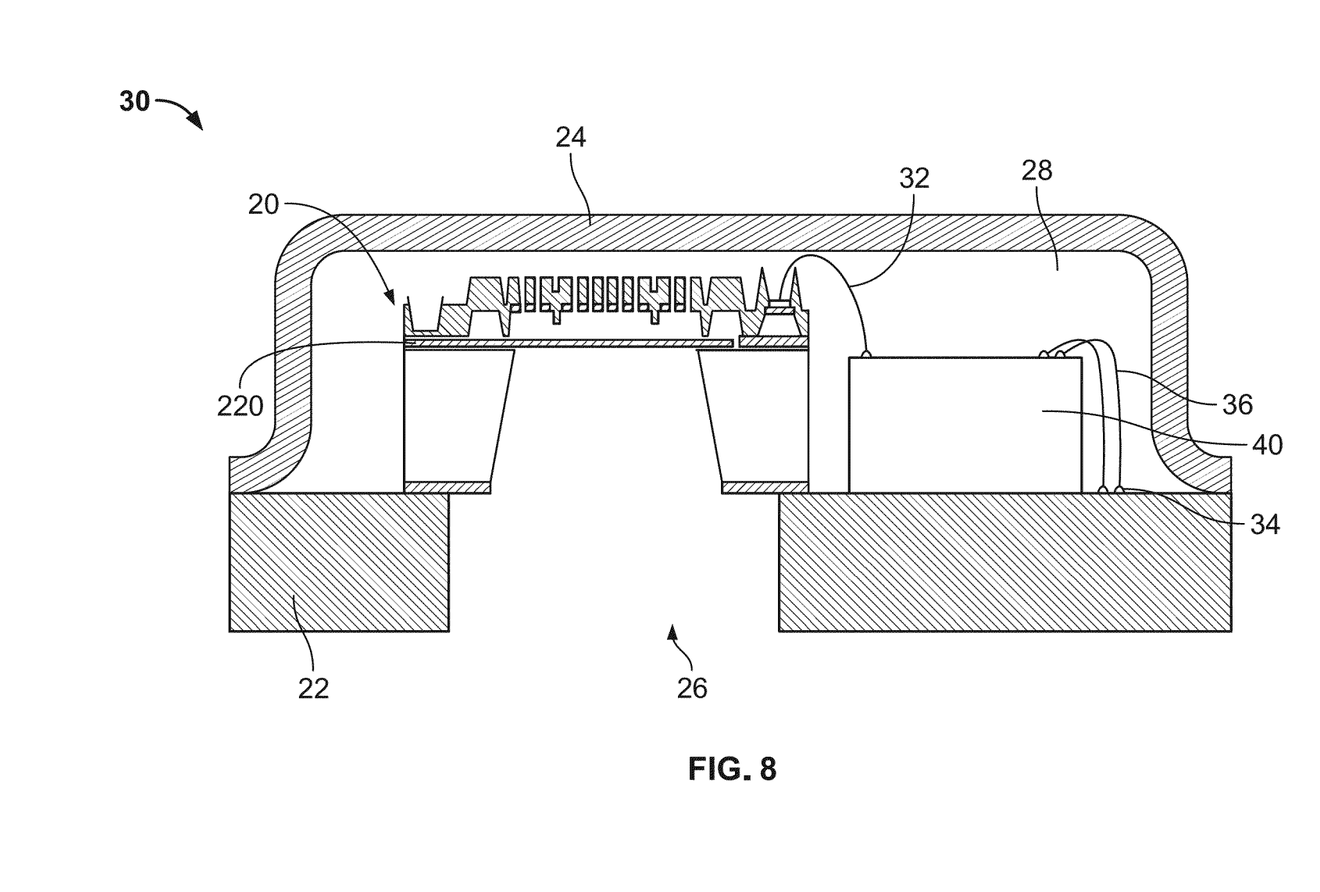
FIG. 8 is a side cross-sectional view of a microphone assembly, according to an illustrative embodiment.

According to an illustrative embodiment, as shown in FIG. 8, the MEMS transducer (e.g., the acoustic transducer 20 of FIG. 6), is configured to be received within a microphone assembly, shown as assembly 30. As shown in FIG. 8, the assembly 30 includes a housing including a microphone substrate 22, a cover 24 (e.g., a housing lid), and a sound port 26. The cover 24 is coupled to the microphone substrate 22 (e.g., the cover 24 may be mounted onto a peripheral edge of the microphone substrate 22). Together, the cover 24 and the microphone substrate 22 may form an enclosed volume 28 for the assembly 30. As shown in FIG. 8, the sound port 26 is disposed on the microphone substrate 22 and is structured to convey sound waves to a transducer 20 located within the enclosed volume 28. Alternatively, the sound port 26 may be disposed on the cover 24 or on a side wall of the housing. In some embodiments, the assembly may form part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

As shown in FIG. 8, the assembly 30 additionally includes an electrical circuit disposed in the enclosed volume 28. The electrical circuit includes an integrated circuit (IC) 40. The IC 40 may be an application specific integrated circuit (ASIC). Alternatively, the IC 40 may include another type of semiconductor die integrating various analog, analog-to-digital, and/or digital circuits.

In the embodiment of FIG. 8, the transducer 20 is configured to generate an electrical signal (e.g., a voltage) at a transducer output in response to acoustic activity incident on the port 26. As shown in FIG. 8, the transducer output includes a pad or terminal of transducer 20 that is electrically connected to the electrical circuit via one or more bonding wires 32. The pad may be the same or substantially similar to the pads 224 or 226 described with reference to FIG. 6. The assembly 30 of FIG. 8 further includes electrical contacts, shown schematically as contacts 34 disposed on a surface of the microphone substrate 22. The contacts 34 may be electrically coupled to the electrical circuit (e.g. via wire bonds 36) and may be configured to electrically connect the microphone assembly 30 to one of a variety of host devices.

The MEMS acoustic transducer, of which various illustrative embodiments are disclosed herein, provides several advantages over free plate diaphragm designs without spring members. A diaphragm of the transducer includes at least one spring member structured to space the diaphragm from both the transducer substrate and the back plate in the presence of a bias voltage. The spring members are structured to support the diaphragm in between the back plate and the transducer substrate without impacting the operational compliance of the diaphragm. Among other benefits, the spring members may be formed from existing materials used in the fabrication of the MEMS transducer, thereby reducing costs. Furthermore, the dimensions, shape, and number of spring members can be modified to minimize the risk of dust, dirt, and other contaminants from becoming trapped within the transducer.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A MEMS acoustic transducer, comprising:
   a transducer substrate including an opening;
   a back plate comprising a plurality of protrusions oriented substantially perpendicular to the back plate;
   a diaphragm oriented substantially parallel to the back plate, located between the transducer substrate and the back plate, and spaced apart from both the transducer substrate and the back plate, the diaphragm structured to move toward the back plate and contact at least one of the plurality of protrusions in the presence of a bias voltage between the diaphragm and the back plate, the diaphragm comprising:
      a lead structured to suspend the diaphragm over the transducer substrate; and
      a plurality of spring members structured to apply a spring force to separate the diaphragm from the transducer substrate and the back plate in the absence of the bias voltage, the plurality of spring members contributing 25% or less to a restoring force of the diaphragm when powered.

2. The MEMS acoustic transducer of claim 1, wherein the spring members are structured to extend to allow the diaphragm to contact the protrusions in the presence of the bias voltage.

3. The MEMS acoustic transducer of claim 1, wherein together the spring members contribute 10% or less to a restoring force of the diaphragm when powered.

4. The MEMS acoustic transducer of claim 1, wherein the spring members contribute 10% or less to a restoring force of the diaphragm when powered.

5. The MEMS acoustic transducer of claim 1, wherein the lead is a thin rectangular member that extends substantially radially outward from a perimeter of the diaphragm to the transducer substrate.

6. The MEMS acoustic transducer of claim 1, wherein a first end of at least one of the spring members is coupled to the diaphragm proximate to a perimeter of the diaphragm, and wherein a second end of the at least one spring member is coupled to the transducer substrate.

7. The MEMS acoustic transducer of claim 1, wherein a first end of at least one of the spring members is coupled to the diaphragm at multiple locations on the diaphragm, and wherein a second end of the at least one of the spring member is coupled to the transducer substrate at multiple locations on the transducer substrate.

8. The MEMS acoustic transducer of claim 1, wherein the lead and the spring members are spaced at equal intervals about a perimeter of the diaphragm.

9. The MEMS acoustic transducer of claim 1, wherein at least one of the spring members includes a serpentine portion when viewed normal to the diaphragm.

10. The MEMS acoustic transducer of claim 1, wherein the spring members are formed with the diaphragm as a single piece of material.

11. The MEMS acoustic transducer of claim 1, wherein a thickness of each of the spring members is approximately the same as a thickness of the diaphragm.

12. A microphone assembly, comprising:
    a housing comprising a base, a cover, and a port, wherein the housing defines an enclosed volume;
    an acoustic transducer disposed in the enclosed volume, wherein the acoustic transducer comprises:
       a transducer substrate including an opening;
       a back plate comprising a plurality of protrusions oriented substantially perpendicular to the back plate;
       a diaphragm oriented substantially parallel to the back plate, located between the transducer substrate and the back plate, and spaced apart from both the transducer substrate and the back plate, the diaphragm structured to move toward the back plate and contact at least one of the plurality of protrusions in the presence of a bias voltage between the diaphragm and the back plate, the diaphragm comprising:
          a lead structured to suspend the diaphragm over the transducer substrate; and
          a plurality of spring members structured to apply a spring force to separate the diaphragm from the transducer substrate and the back plate in the absence of the bias voltage, the plurality of spring members contributing 25% or less to a restoring force of the diaphragm when powered.

13. The microphone assembly of claim 12, wherein the spring members are structured to extend to allow the diaphragm to contact the protrusions in the presence of the bias voltage.

14. The microphone assembly of claim 12, wherein together the spring members contribute 10% or less to a restoring force of the diaphragm when powered.

15. The microphone assembly of claim 12, wherein together the spring members contribute 10% or less to a restoring force of the diaphragm when powered.

16. The microphone assembly of claim 12, wherein the lead is a thin rectangular member that extends substantially radially outward from a perimeter of the diaphragm to the transducer substrate.

17. The microphone assembly of claim 12, wherein a first end of at least one of the spring members is coupled to the diaphragm proximate to a perimeter of the diaphragm, and wherein a second end of the at least one spring member is coupled to the transducer substrate.

18. The microphone assembly of claim 12, wherein a first end of at least one of the spring members is coupled to the diaphragm at multiple locations on the diaphragm, and wherein a second end of the at least one spring member is coupled to the transducer substrate at multiple locations on the transducer substrate.

19. The microphone assembly of claim 12, wherein the lead and the spring members are spaced at equal intervals about a perimeter of the diaphragm.

20. The microphone assembly of claim 12, wherein at least one of the spring members includes a serpentine portion when viewed normal to the diaphragm.

21. The microphone assembly of claim 12, wherein the spring members are formed with the diaphragm as a single piece of material.

22. The microphone assembly of claim 12, wherein a thickness of each of the spring members is approximately the same as a thickness of the diaphragm.

* * * * *